US010916818B2

(12) United States Patent
 Gao (10) Patent No.: US 10,916,818 B2
(45) Date of Patent: Feb. 9, 2021

(54) SELF-ACTIVATING THERMAL MANAGEMENT SYSTEM FOR BATTERY PACK

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 16/449,194

(22) Filed: Jun. 21, 2019

(65) Prior Publication Data

US 2020/0403283 A1 Dec. 24, 2020

(51) Int. Cl.
| H05K 7/20 | (2006.01) |
| H01M 10/6569 | (2014.01) |
| H01M 10/613 | (2014.01) |
| H01M 10/6551 | (2014.01) |
| H01M 10/6568 | (2014.01) |
| H05K 7/14 | (2006.01) |
| H01M 2/10 | (2006.01) |

(52) U.S. Cl.
CPC ..... *H01M 10/6569* (2015.04); *H01M 2/1077* (2013.01); *H01M 10/613* (2015.04); *H01M 10/6551* (2015.04); *H01M 10/6568* (2015.04); *H05K 7/1492* (2013.01); *H05K 7/20309* (2013.01); *H05K 7/20318* (2013.01); *H05K 7/20818* (2013.01); *H01M 2220/10* (2013.01)

(58) Field of Classification Search
CPC ........... H01M 10/613; H01M 10/6569; H01M 10/6551; H01M 10/6568; H01M 2/1077; H01M 2220/10; H05K 7/1492; H05K 7/20309; H05K 7/203; H05K 7/20318; H05K 7/20236; H05K 7/20818
See application file for complete search history.

(56) References Cited

U.S. PATENT DOCUMENTS

| 3,406,244 A * | 10/1968 | Oktay ................ G06F 1/20 174/15.1 |
| 4,007,315 A * | 2/1977 | Brinkmann ......... H01M 10/613 429/62 |
| 9,992,903 B1 * | 6/2018 | Dufresne ............. H05K 7/1489 |
| 10,403,941 B2 * | 9/2019 | Arai .................... H01M 10/613 |
| 10,547,091 B2 * | 1/2020 | Tajima ............... H01M 10/6569 |
| 2006/0056142 A1 * | 3/2006 | Takahashi ............ G11B 33/142 361/679.33 |

(Continued)

*Primary Examiner* — Jacob R Crum
(74) *Attorney, Agent, or Firm* — Womble Bond Dickinson (US) LLP (57) ABSTRACT

A battery system can include an evaporation chamber and condenser. One or more battery cells can be immersed in a fluid where the battery cells and the fluid are housed in the evaporation chamber. The condenser can be fluid connected to the evaporation chamber through one or more vapor channels and one or more liquid channels. When the battery cells charge and discharge, heat dissipated by the battery cells is absorbed by the fluid, causing the fluid to change from liquid to vapor. The vapor travels through the one or more vapor channels into the condenser where the vapor changes back to liquid and returns to the evaporation chamber through the one or more liquid channels. The thermal management solution is a self-sensing and self-regulating system.

19 Claims, 10 Drawing Sheets

(56) References Cited

U.S. PATENT DOCUMENTS

| | | | | |
|---|---|---|---|---|
| 2010/0252238 A1* | 10/2010 | Batty | ................... | F28F 23/00 |
| | | | | 165/104.21 |
| 2011/0027631 A1* | 2/2011 | Koenigsmann | ..... | H01M 2/1077 |
| | | | | 429/62 |
| 2012/0003510 A1* | 1/2012 | Eisenhour | ........... | H01M 10/613 |
| | | | | 429/50 |
| 2012/0003515 A1* | 1/2012 | Eisenhour | ........... | H01M 10/658 |
| | | | | 429/62 |
| 2014/0218861 A1* | 8/2014 | Shelnutt | ............ | H05K 7/20809 |
| | | | | 361/679.53 |
| 2015/0188203 A1* | 7/2015 | Enomoto | .......... | H01M 10/5075 |
| | | | | 429/83 |
| 2015/0325824 A1* | 11/2015 | Hasegawa | ............... | H01M 2/26 |
| | | | | 429/53 |
| 2017/0181324 A1* | 6/2017 | Shelnutt | ............ | H05K 7/20781 |
| 2017/0325355 A1* | 11/2017 | Lau | ........................ | H05K 7/203 |
| 2017/0338527 A1* | 11/2017 | Walton | ............... | H01M 10/613 |
| 2018/0343774 A1* | 11/2018 | Smith | ....................... | G06F 1/20 |
| 2018/0364795 A1* | 12/2018 | Li | ........................... | G06F 16/23 |
| 2019/0200483 A1* | 6/2019 | Tian | ...................... | H05K 7/203 |
| 2019/0319232 A1* | 10/2019 | Ryu | .................... | H01M 10/643 |

\* cited by examiner

SELF-ACTIVATING THERMAL MANAGEMENT SYSTEM FOR BATTERY PACK

TECHNICAL FIELD

Embodiments of the present disclosure relate generally to a battery. More particularly, embodiments of the disclosure relate to a battery with self-activated thermal management utilizing phase change of a fluid and natural convection.

BACKGROUND

Lithium-ion batteries are commonly used in the vehicle industry, for example, electric vehicles and plug-in hybrids. Lithium ion battery packs for electric vehicles are designed for vehicle specific requirements and usage. Lithium-ion batteries, however, are also becoming popular in the data center space and attracting much attention from the industry.

Large clusters of computer servers can be kept in dedicated facilities, often in a rack enclosure. The servers can be used in support of the data center industry. Use of a battery backup unit (BBU) in place of traditional solutions, such as lead-acid based Uninterruptible Power Supply (UPS) systems, has grown in popularity. One result of the BBU's new role in the data center space is the relocation of the BBU from a centralized battery room to a data center IT room. Thermal environment (e.g., temperature) in the data center is generally managed and operated based on specifications and requirements of the servers, not batteries.

The use of batteries as a BBU in a data center environment is unique and different, for example, from vehicle applications. Active thermal management systems, for example, like those present in electric vehicles, actively monitor temperature at different locations of a battery pack and will behave accordingly based on the monitored temperatures to avoid high heat conditions. For example, an electric vehicle may have temperature sensors located at different cells. If the temperature exceeds a threshold then the management system can turn on fans or pump coolant through the battery pack to reduce the temperature.

In contrast, in the case of a BBU, the battery provides power only when backup power is needed (e.g., there is a power outage to the data center). When backup power is no longer needed (e.g., grid power is restored to the data center), then the BBU is recharged. Thus, a unique problem in the BBU application is that thermal management or cooling will be active only during limited times—e.g., discharging during a power outage and charging after power is restored. A self-activating thermal management system can provide a solution to such a problem, without requiring active management and monitoring of the cells when the BBU is not needed. In addition, Pumps that circulate fluid through battery cells and battery packs, however, can be prone to failure. Thus, a system without such pumps can be more reliable.

In addition, a self-activating thermal management system should be fast enough to avoid thermal overshoot, which can negatively impact battery performance and battery lifetime. Thus, thermal design for BBU applications (e.g., in an IT room) has unique challenges, and there is a need to address such challenges to provide backup power for servers. In addition, an ideal thermal management solution is capable of maintaining the battery within a certain temperature range under dynamic conditions of the battery, as opposed to merely "keeping the battery cool."

BRIEF DESCRIPTION OF THE DRAWINGS

Embodiments of the invention are illustrated by way of example and not limited in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to one aspect, a battery module includes an evaporation chamber, one or more battery cells immersed in a fluid, the one or more battery cells and the fluid being housed in the evaporation chamber, and a condenser being in fluid connection with the evaporation chamber through one or more vapor channels and one or more liquid channels. During operation, thermal energy from the one or more battery cells is absorbed by the fluid causing the fluid to change from liquid to vapor and travel through the one or more vapor channels into the condenser. The vapor changes back to liquid in the condenser and returns to the evaporation chamber through the one or more liquid channels.

In one embodiment, the condenser is located apart from the evaporation chamber, connected through one or more vapor lines and one or more liquid lines that form the one or more vapor channels and one or more liquid channels, respectively. The condenser is located at a higher position than the evaporation chamber. The one or more vapor channels has an opening at the evaporator that is larger than an opening of the one or more liquid channels at the evaporator. In one embodiment, the condenser is located above the evaporation chamber. One or more vapor channels are located at a first side of the evaporation chamber and the one or more liquid channels are located at a second side of the evaporation chamber being opposite the first side. The one or more vapor channels has an opening at the evaporator that is larger than an opening of the one or more vapor channels at the condenser to funnel the vapor to the condenser.

In one embodiment, a condensing chamber of the condenser is horizontally sloped such that an opening of the one or more vapor channels is higher than an opening of the one or more liquid channels to guide the liquid in the condensing chamber towards the one or more liquid channels. The one or more liquid channels are located along the walls of the evaporation chamber surrounding the one or more cells and the one or more vapor channels are located in a remaining area of the evaporation chamber above the one or more cells.

In one embodiment, a cooling member of the condenser has one or more fins or grooves that provide additional surface area to remove and transfer heat away from the battery system through air cooling. The condenser has a coolant dispersed in one or more cooling channels, the coolant circulating to and from the condenser during operation to remove heat from the battery system. The coolant is circulated to and from the condenser by a manifold of an electronics rack enclosure that the battery system, or a battery pack that includes a plurality of battery systems, is housed in. The battery module is one of a plurality of battery modules that form a battery pack, and the battery pack is housed in an electronics rack enclosure, the battery pack supplying back-up battery power to other electronics housed in the electronics rack. In one embodiment, each of the one or more vapor channels are larger in cross section or diameter than each of the one or more liquid channels. An opening of the one or more vapor channels to the evaporation chamber covers a majority of space at a top area of the evaporation chamber.

According to another aspect, a battery pack includes a number of battery modules. Each of the battery modules may be implemented similar to a battery module as described above. According to a further aspect, an electronic rack includes a stack of server blades having information technology (IT) components herein, a power supply to supply power to the IT components, and a battery pack to provide backup power to the IT components when the power supply is unavailable. The battery pack includes a number of battery modules and each battery module may be implemented similar to a batter module described above.

General

A cooling system or thermal management system for a battery pack can addressed specific needs of backup power provided by a BBU in support of IT racks in a data center or IT room environment. As described, conditions and requirements of a BBU in an IT rack, data center, and/or IT room environment are different from conditions and requirements of a battery pack in an electrical vehicle application. For example, thermal environments are different, and the discharging and charging cycles occur much less in the data center application scenario than in the electrical vehicle application.

Cooling systems for batteries can be critical because nominal battery performance is typically specified for working temperatures ranges of battery cells (e.g., 25° C. to 35° C.). Temperature also plays an important role with respect to battery aging. Temperatures outside of the working range may result in reduced performance and negatively impact battery health. In addition, when multiple battery cells are connected, there can be large internal differences between different cell temperatures, which can lead to different charge and discharge rates for each cell and deteriorate performance of the battery pack. Importantly, if battery temperature exceeds safety thermal limits, this can cause extreme damage or harm, even catastrophic results. Thus, thermal management of battery systems are important features to consider in the design and operation of a battery because it impacts how a battery performs, the health and lifetime of the batter, and safety.

A thermal management system for a battery system can be self-activating by utilizing phase change natural convection heat transfer. In one aspect, a battery system includes a) an evaporation chamber, which is also a battery chamber, b) one or more battery cells immersed in a fluid, the one or more battery cells and the fluid being housed in the evaporation chamber, and c) a condenser being in fluid connection with the evaporation chamber through one or more vapor channels (or 'risers') and one or more liquid channels (or 'down comers'). The battery cells can be fully or partially immersed in the fluid.

When the cells charge or discharge, thermal energy generated by the one or more battery cells is absorbed by the fluid causing the fluid to change from liquid to vapor and travel through the one or more vapor channels into the condenser where the vapor changes back to liquid and returns to the evaporation chamber through the one or more liquid channels.

Each of the vapor channels is larger in cross section or diameter than each of the one or more liquid channels. Density difference between the vaporized fluid and liquid fluid and gravity can cause the vapor to naturally and passively travel through the larger vapor channels to balance pressure in the connected battery chamber and condenser. The condenser can extract and transfer thermal energy away from the vapor fluid, thereby turning the vapor back to liquid. The liquid can travel through the one or more liquid channels back to the evaporation chamber, also aided by gravity.

In such a manner, the battery uses thermosiphon technology (e.g., phase change natural convection) to automatically activate thermal management for a battery module (and battery pack having a plurality of battery modules, a battery module having multiple cells) by changing fluid phases, circulating fluid and transferring thermal energy away from the battery cells only when they get hot. Heat is transferred using natural convection (fluid is circulated using density difference and gravity) without need of a mechanical pump. This can improve reliability because pumps can be prone to failure and fluid lines can complicate a design and add additional points of failure.

Figure 1:
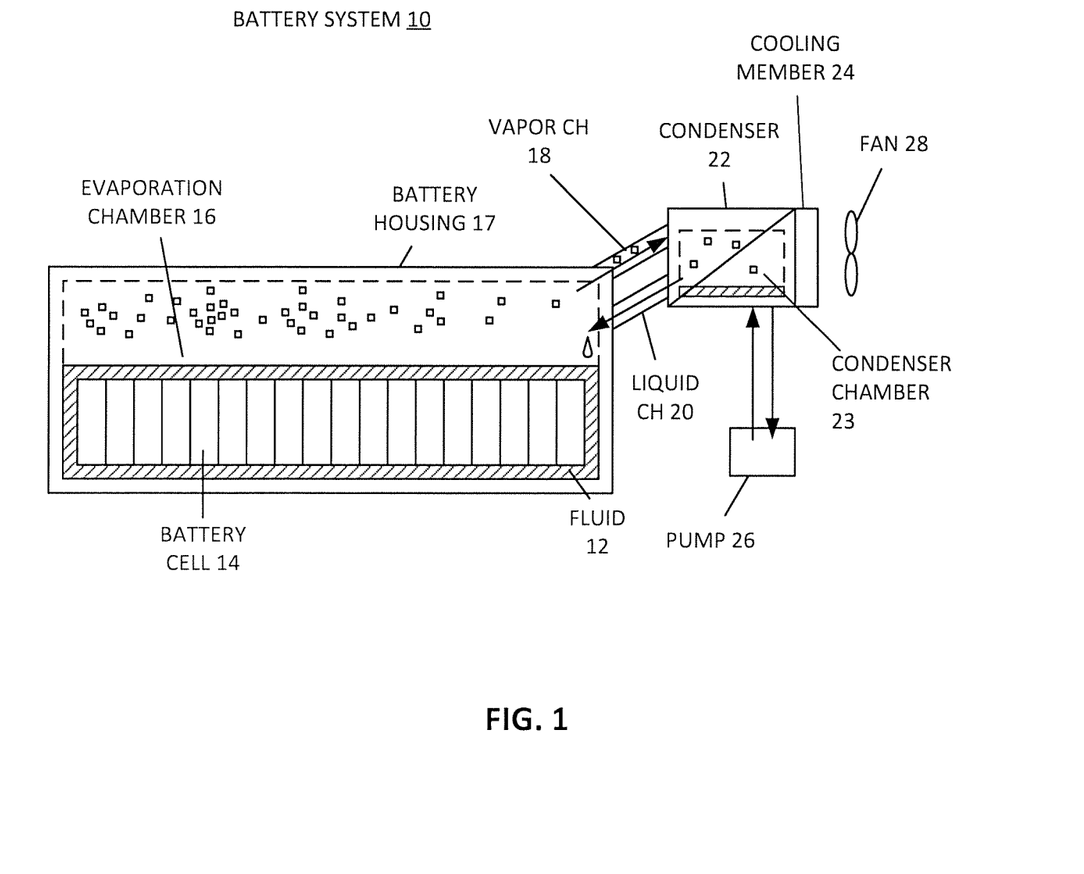
FIG. 1 shows a battery module or system with remote condenser, according to one embodiment.

The battery can have different shapes and configurations. In one embodiment, the condenser of the battery system can be remote, connected to the battery chamber through vapor and liquid lines, as shown in FIG. 1.

Alternatively, the condenser can be stacked and/or mounted above the battery chamber, as shown in FIGS. 2, 3, and 4A-4B to form a more integral solution. In one embodiment, as shown in both FIGS. 2, 3 and 4A-4B, an opening of the one or more vapor channels to the evaporation chamber covers a majority of space at a top area of the evaporation chamber. The remainder of space above the evaporation chamber is covered by an opening of the one or more liquid channels.

Figure 2:
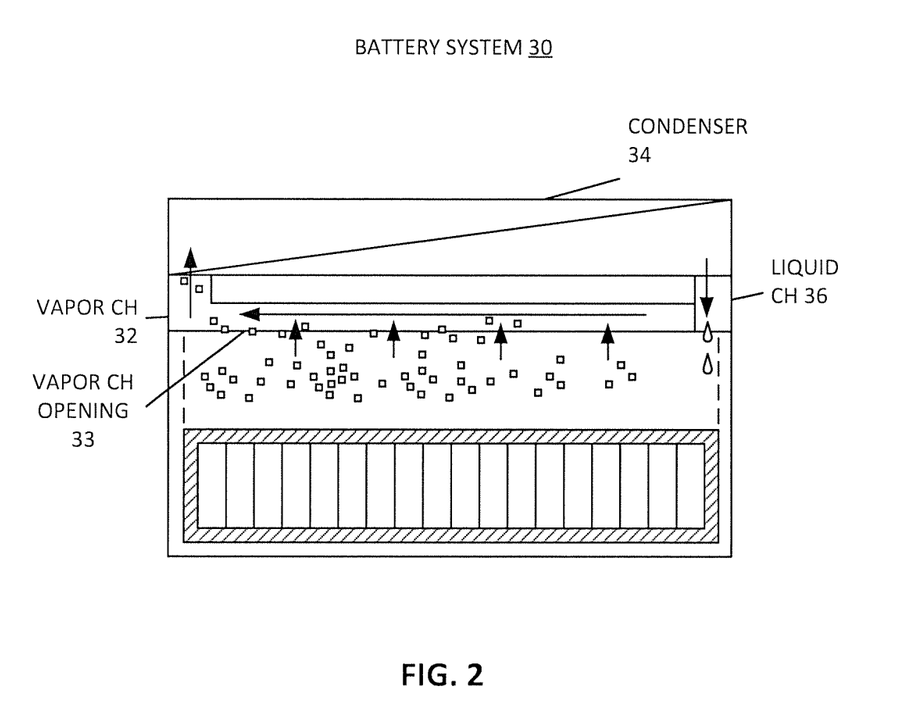
FIG. 2 shows a battery module or system with local condenser mounted onto the battery chamber, according to one embodiment.
Figure 4A:
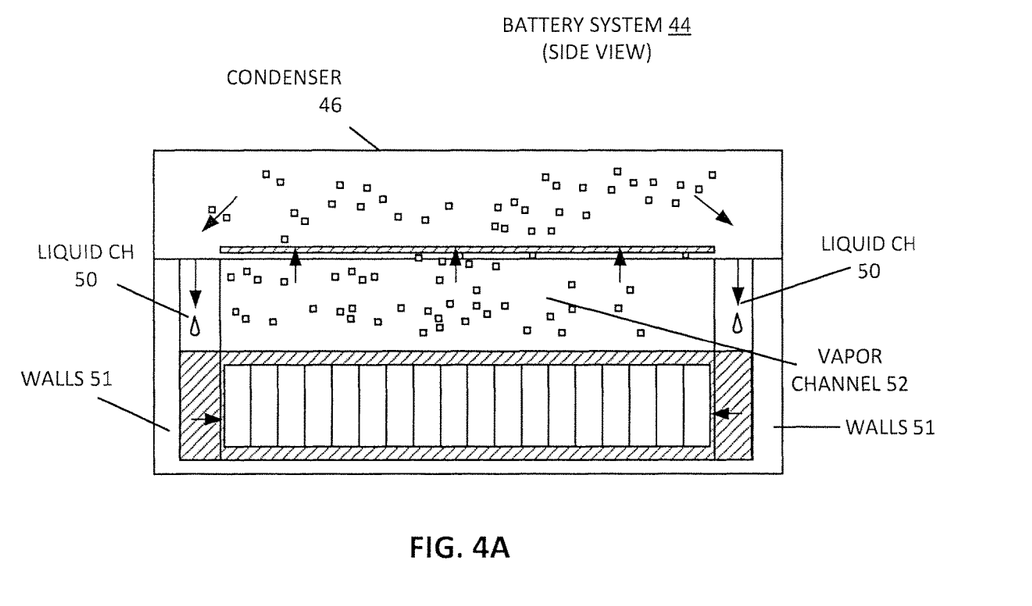
FIGS. 4A and 4B show a condenser having a liquid return channel along a perimeter of the battery chamber, according to one embodiment.
Figure 4B:
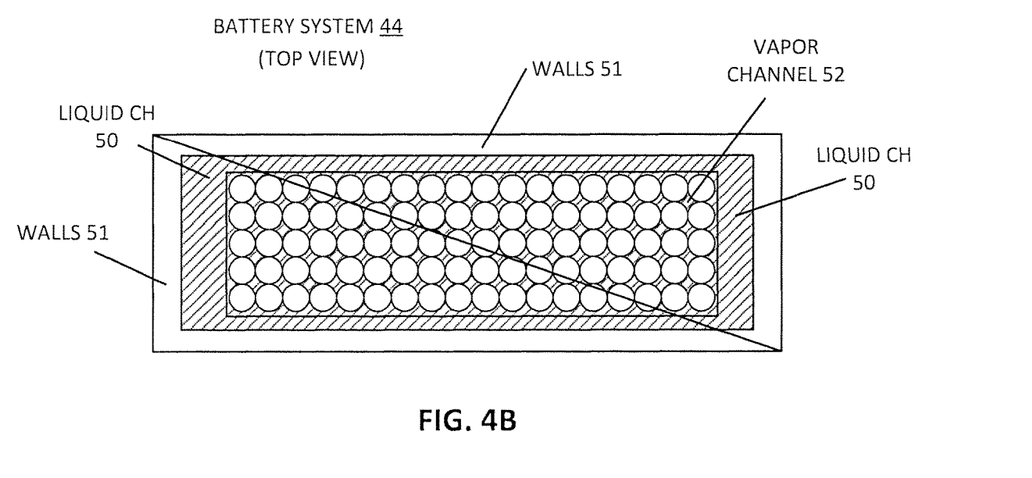

In one embodiment, the battery system has a cuboid shape, formed by the evaporation chamber that houses the batteries at a bottom portion of the cuboid shape, and the condenser at a top portion of the cuboid shape (for example, as shown in FIGS. 2 and 4A-4B).

It should be mentioned that the phrase 'battery system' as used herein can be interchangeable with 'battery module'. A 'battery pack' can include a plurality of battery modules. A battery module can include a plurality of battery cells. Other features are also described in the following examples. The thermal management solution is the same for the battery cells which are arranged in different configurations.

Battery Module with Remote Condenser

In one aspect, as shown in FIG. 1, a battery system 10 can include a battery housing 17 that forms an evaporation chamber 16 that houses one or more battery cells 14 immersed in a fluid 12.

A condenser 22 can be in fluid connection with the evaporation chamber through one or more vapor channels 18 and one or more liquid channels 20. The condenser can be described as having a cooling member 24 and a condensing chamber 23 that the fluid resides in when in the condenser.

The cooling member 24 can include, for example, an air-cooled heatsink that can utilize a fan 28. Additionally or alternatively, the cooling member can include a cold-plate with coolant circulating through it, the coolant being moved by a pump 26. The condenser can have other cooling means to extract thermal energy from the fluid.

In another embodiment, the cooling member and condenser are one single unit as a radiator. Fan 28 is used for moving the cooling air through the condenser 22 and cooling member 24.

The 'condensing chamber' of the condenser can have different geometries, for example, it can be a large central chamber, a long narrow and snaking chamber, a plurality of small chambers, or combinations thereof. It should be understood that different condenser geometries and techniques can be selected and determined based on application specific requirements and routine experimentation.

The vapor channels and the liquid channels can be formed from pipes that lead from the battery housing 17 to the condenser 22. Thus, the condenser can be apart from the battery housing. In one aspect, the condenser or condensing chamber can be located at a higher position than the evaporation chamber, as shown in FIG. 1. In such a case, gravity further assists the movement of fluid between the evaporation chamber and the condenser, although not required.

When deployed, the thermal system of the BBU remains inactive when the batteries are neither charging nor discharging. In such situation, the fluid which the cells are submersed in also provide a good thermal environment for the cells by reducing the effect of the variations and dynamics in the ambient environment, such as data center thermal environment variations, surrounding IT and server heat generations as well as data center cooling condition variations. The fluid provides a good thermal buffer between the cell and the surrounding environment of the BBU pack. When the BBU charges or discharges, the thermal system turns into active mode automatically, without requiring any external control system. The thermal system is a self-sensing and self-regulating system based on actual BBU working dynamics.

Example with Stacked Condenser

Referring now to FIG. 2, a battery system 30 can have a condenser 34 located above the battery chamber. This can provide a compact and integral solution.

In one aspect, one or more vapor channels 32 are located at a first side of the evaporation chamber and the one or more liquid channels 36 are located at a second side of the evaporation chamber being opposite the first side. The vapor can collect and travel up the first side of the evaporation chamber where the vapor turns to liquid and travels back to the evaporation chamber on the opposite side. By guiding the fluid through the length of the condenser and battery chamber, the fluid can have increased exposure to cooling areas of the condenser (being forced to travel the distance of a cooling member) and reduce hotspots by promoting fluid circulation through all the battery cells.

In one aspect, the one or more vapor channels 32 has an opening 33 at the evaporator that is larger than an opening of the one or more liquid channels 36 at the condenser to help funnel the vapor to the condenser. For example, the vapor channel 32 can have a vapor channel opening 33 that covers the majority of area above the evaporation/battery chamber, to aid in collection of the vapor. The liquid channel 36 can be much smaller than the vapor channel, because gravity will naturally guide the liquid down, even through a narrow channel.

Figure 3:
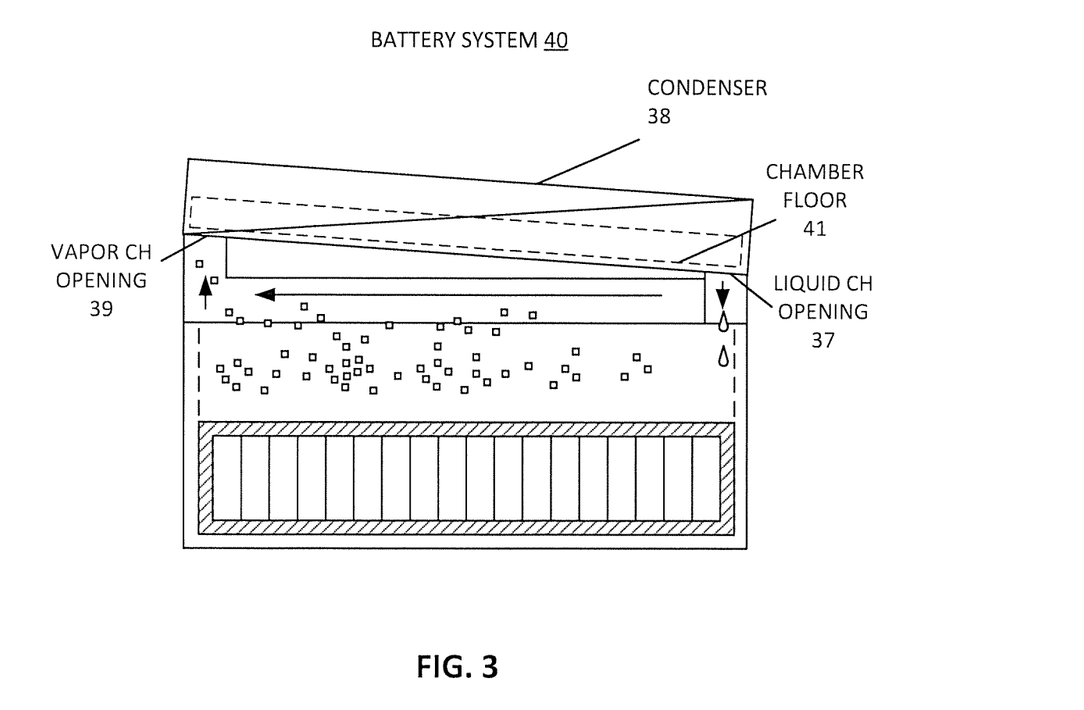
FIG. 3 shows a condenser with a slope, according to one embodiment.

In one aspect, as shown in FIG. 3, a battery system 40 has a condenser 38 that has a horizontal slope so that liquid flows down the slope from the vapor channels to the liquid channels. For example, a floor 41 of the condensing chamber (which, as already mentioned, can be a central chamber, one or more narrower paths, a plurality of chambers, or combinations thereof) can be sloped such that an opening 39 of the one or more vapor channels at the condenser and/or condensing chamber is higher than an opening 37 of the one or more liquid channels at the condensing chamber, to help guide the liquid in the condenser towards the one or more liquid channels. It should be understood that such a feature is optional, and that the fluid can circulate even without such a feature.

Liquid Return Channel Loop

Referring now to FIG. 4A and FIG. 4B, a battery system is shown, in one embodiment, having one or more liquid channels 50 that are located along the perimeters of the battery chamber, and the one or more vapor channels 52 can be located in the center of the battery chamber.

For example, one or more liquid channels 50 are shown along external walls 51 that surround the one or more cells. The one or more vapor channels 52 are located in a remaining area or space of the evaporation chamber above the one or more cells. Thus, the vapor channel can collect the vapor in a large area or space above the battery, and draw the vapor into the condenser 46.

The condenser will extract thermal energy from the vapor, causing the vapor to change phase to a liquid and travel back the evaporation chamber through the liquid channel 50 surrounding the batteries. This can maximize an area for vapor collection and provide a uniform return of fluid (e.g., all around the batteries) to the battery/evaporation chamber, rather than at just one side.

Battery Packs and Cells

It should be understood that a battery pack can include a plurality of battery cells connected in series and/or in parallel with known connection hardware. The exact configuration of the cells can be determined based on application requirements (for example, voltage, current, and energy capacity) and routine experimentation.

The battery cells can have a cylindrical in shape. In some cases, the battery cells can have a known or standard form factor, for example, 18650, 18659, 20700, 21700, etc. The battery cells can each have lithium ion chemistry, or other battery chemistries. The number of cells packaged within one pack can be defined based on requirements such as, but not limited to, power density, energy, discharge voltage and current and so on. The current thermal solution also reduces or eliminates the thermal bottom neck of battery pack design, because all the cells are immersed in a fluid, they experience similar thermal environment regardless of the cell arrangement configurations.

In one aspect, the fluid that the battery cells are immersed in is a dielectric fluid. In one aspect, the fluid is a phase-change fluid. The fluid is trapped (e.g., hermetically sealed) in the connected evaporation chamber and condenser chamber to maintain pressure required for the phase changing boiling points.

Figure 5:
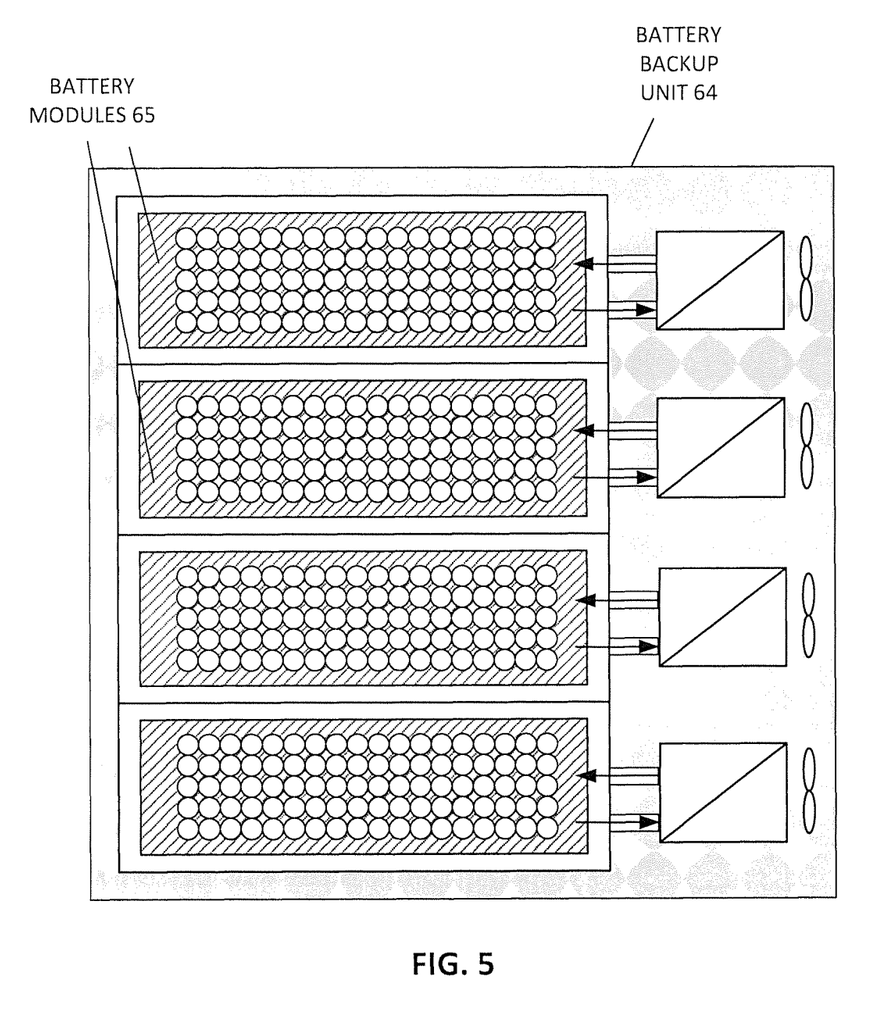
FIGS. 5-7 show a battery pack or BBU, according to some embodiments.

The battery system or module can be combined with other like battery modules to form a battery pack having a plurality of battery systems. For example, FIG. 5 shows a plurality of battery systems or modules 65 that form a battery pack or BBU 64 that have air-cooled condensers.

Figure 6:
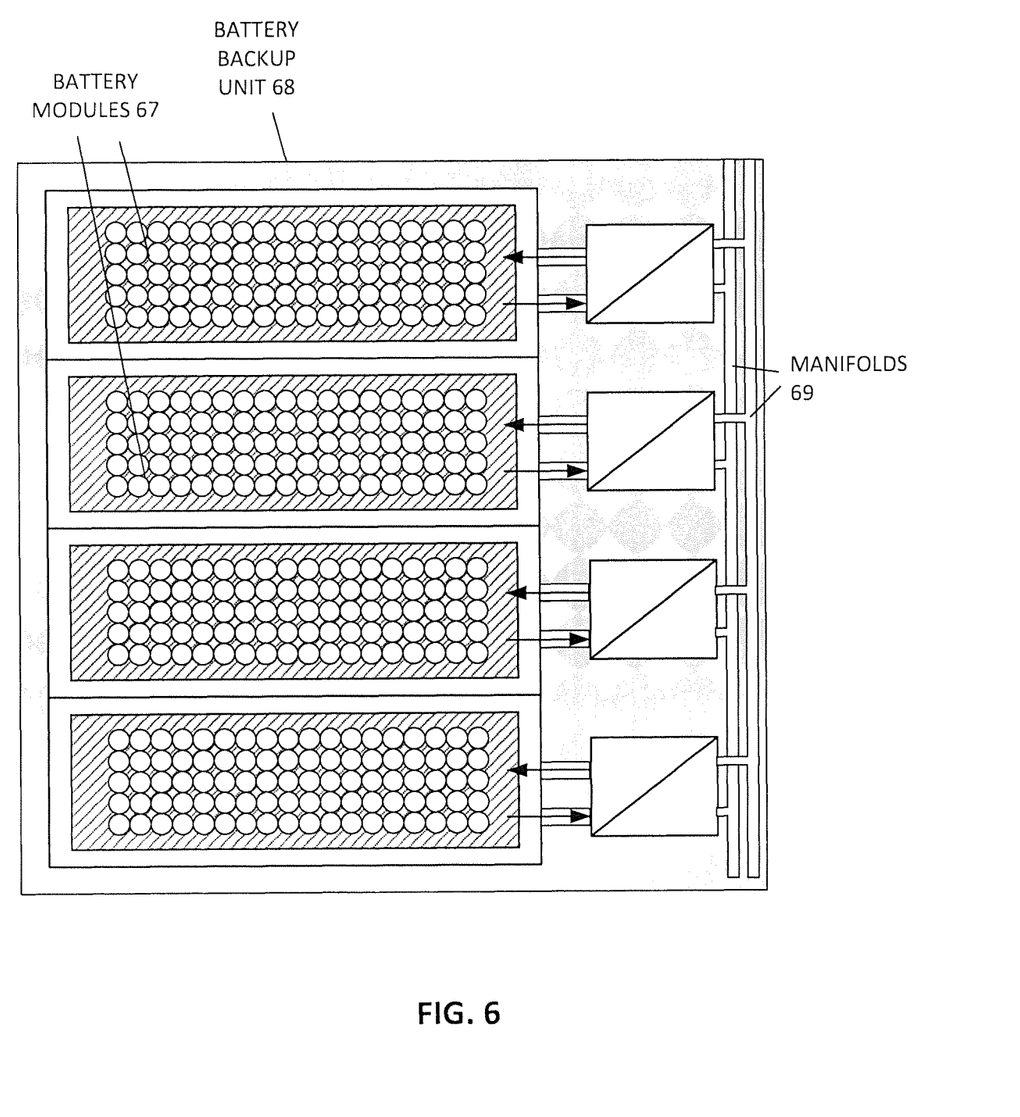

In another example, FIG. 6 shows a battery pack or BBU 68 having condensers that can utilize coolant. The battery pack is formed from a plurality of battery modules 67 that can use delivery and return lines (e.g., manifolds 69) to circulate the coolant to and from each battery module.

Figure 7:
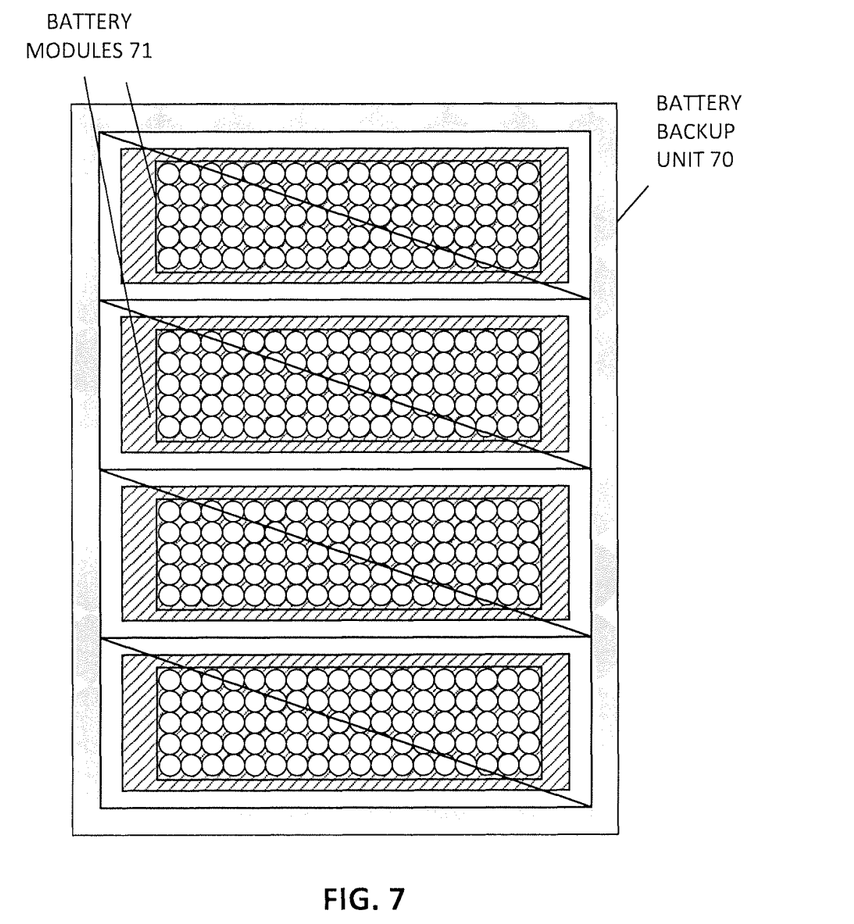

Similarly, FIG. 7 shows a battery pack or BBU 70 formed from a plurality of battery modules 71 where the condenser is stacked and mounted on top of the battery chamber. Such battery modules are shown and described, for example, in FIGS. 2, 3, and 4A-4B. It should be understood that, although not shown in FIG. 7, the battery pack can include coolant lines (that can be integrated with external coolant systems), pumps, fans, and other cooling devices and resources.

It should be understood that, in some cases, a single battery system or module can be used as a 'battery pack' or BBU and contained in an electronics rack enclosure where the module can use air-cooled and/or liquid-cooled means to condense the vaporized fluid having one or more coolant delivery and return lines (e.g., manifolds 69) to circulate the coolant to and from each battery module. In addition, the number of battery cells per pack and the number of battery modules per battery pack, as shown in the drawings, are meant to be illustrative rather than limiting. The exact configurations and quantities can vary depending on application requirements. Other combinations and arrangements of the battery system or module can be used to form a battery pack or BBU.

Battery Pack and Rack Enclosure

Figure 8:
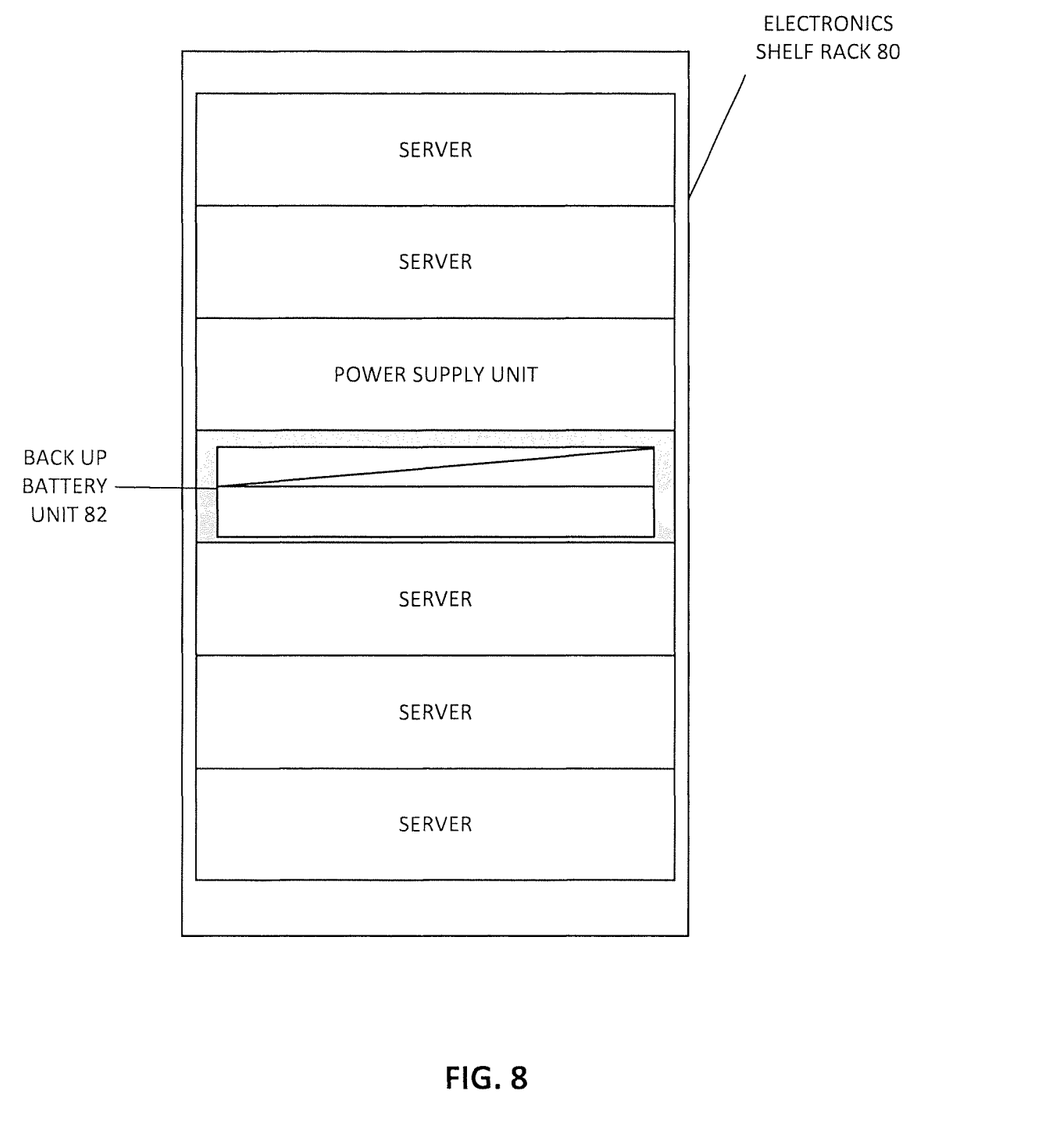
FIG. 8 shows a BBU in an electronic shelf rack, according to one embodiment.

Referring now to FIG. 8, and as described in other examples, a battery pack or BBU 82 can be housed in an electronics shelf rack 80 that can further be located in a data center IT room. The BBU can be liquid cooled, air-cooled, or combinations thereof. Each BBU can have a plurality of battery modules. The racks can implement liquid cooling and/or air cooling techniques.

Producing a Battery Module and Battery Pack

Figure 9:
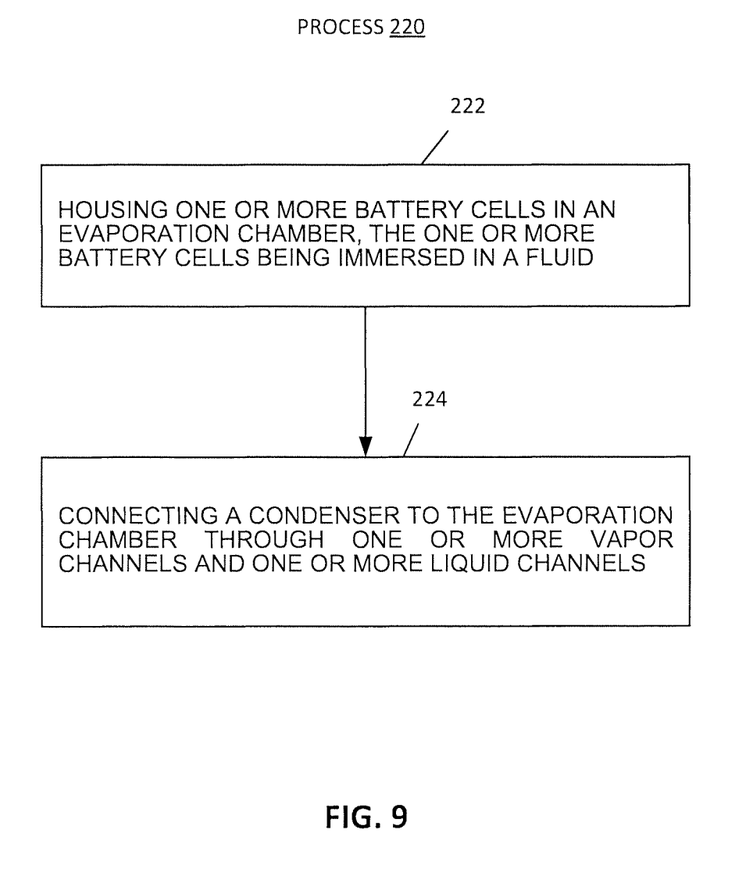
FIG. 9 shows a process for producing a cooling device, according to one embodiment.

In one aspect of the present disclosure, a process 220 is shown in FIG. 9 for producing a battery module. The process includes, at block 222, housing one or more battery cells in an evaporation chamber, the cells being immersed in a fluid.

The process further includes, at block 224, connecting a condenser to the evaporation chamber through one or more vapor channels and one or more liquid channels. The fluid can be trapped in the connected battery chamber and condenser so that pressure is not inadvertently released. The condenser, the channels, and the battery chamber can be hermetically sealed. The battery module can be filled with fluid after the unit is assembled. The system pressure within the BBU can be adjusted based on achieving a target boiling point.

The condenser can be remotely located from the battery housing, as described in relation to FIG. 1, or mounted onto and above the battery chamber, as shown, for example, in FIGS. 2, 3, and 4A-4B.

In one aspect, the process can be repeated to produce a plurality of battery modules. The battery modules can be housed in a battery pack enclosure to form a battery pack or BBU. Battery packs can be assembled based on application requirements, e.g., energy capacity, backup time, rack density, size, weight, cost, voltage, and current.

Although FIG. 9 shows one example of a procedure to produce a battery pack module, other manufacturing processes can be implemented for producing the same. The BBU module pack can be manufactured as one single unit for housing the battery cell and fluid. The BBU module, manufactured as a single unit, can include a battery chamber/enclosure (e.g., formed from sheet metal) as well as the condenser.

Note that a server that is backed by a battery pack/BBU can be any information technology (IT) component or element that when operates, generates heat. A server can include a processor, a field programmable gate array (FPGA), an application specific integrated circuit (ASIC), or any computing components. One or more servers can be placed in an electronic rack of a data center. A server may be contained within a server blade which is inserted into one of the server slots of an electronic rack. Each server includes a processor, a memory, a storage device, and a network interface that are configured to provide data processing services to clients. Such components may generate heat during normal operations. Also note that condensers of the battery modules can each include a cooling member which can be a cold plate using liquid cooling, in which liquid-to-liquid heat exchange is performed using a rack cooling unit, a room cooling unit, and/or a datacenter cooling unit.

Figure 10:
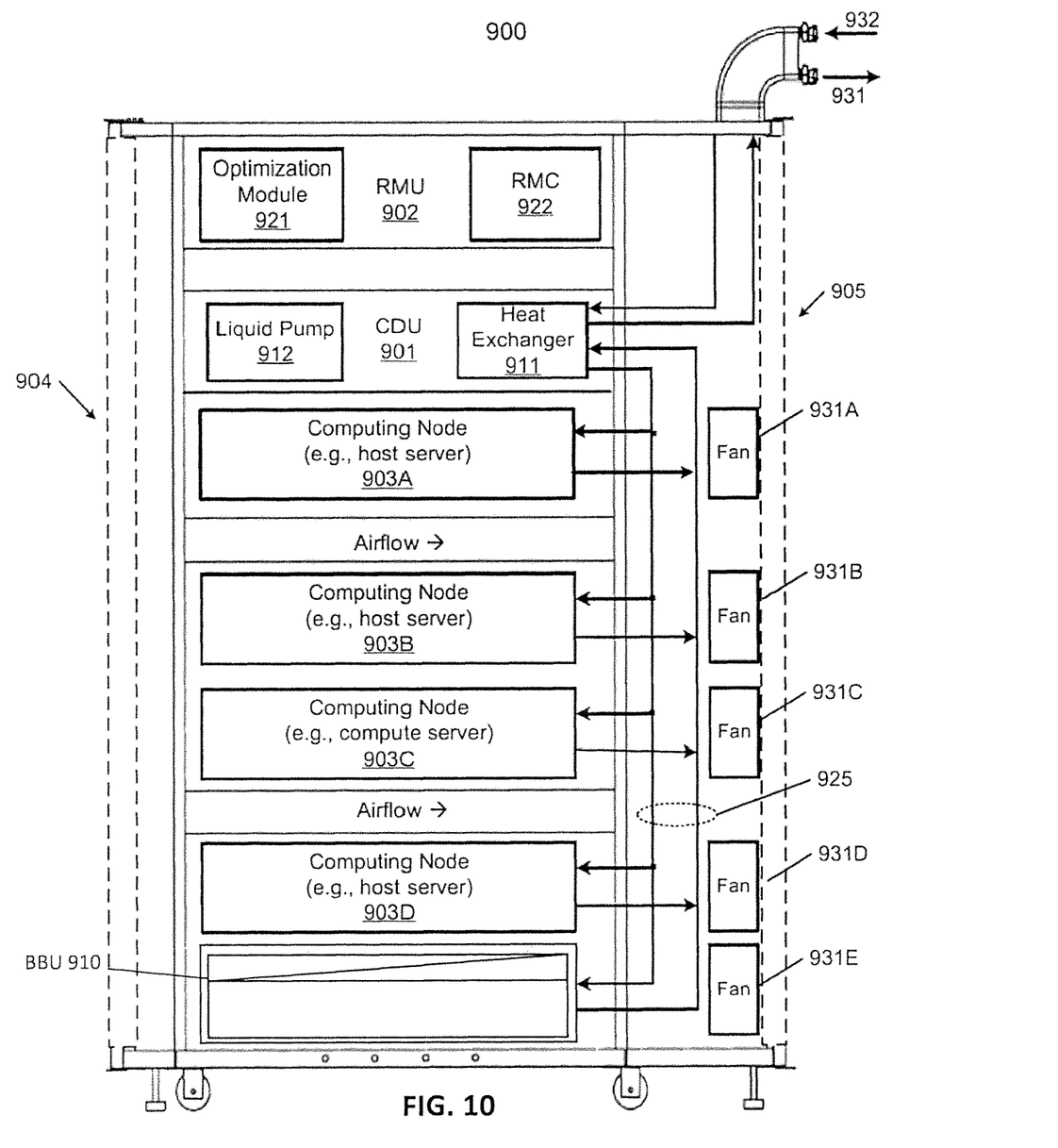
FIG. 10 shows a BBU in an electronic shelf rack, according to one embodiment.

FIG. 10 is a block diagram illustrating an example of an electronic rack according to one embodiment. Electronic rack 900 may contain one or more servers, each server having one or more processing units attached to a bottom of any of the cooling devices described above. Referring to FIG. 10, according to one embodiment, electronic rack 900 includes, but is not limited to, CDU 901, rack management unit (RMU) 902 (optional), a BBU 910 and one or more server blades 903A-903D (collectively referred to as server blades 903). Server blades 903 can be inserted into an array of server slots respectively from frontend 904 or backend 905 of electronic rack 900. The BBU 910 may populate any space within a rack. Note that although there are only five server blades 903A-903D shown here, more or fewer server blades may be maintained within electronic rack 900. Also note that the particular positions of CDU 901, RMU 902, and server blades 903 are shown for the purpose of illustration only, other arrangements or configurations of CDU 901, RMU 902, BBU 910, and server blades 903 may also be implemented. Note that electronic rack 900 can be either open to the environment or partially contained by a rack container, as long as the cooling fans can generate airflows from the frontend to the backend.

In addition, for each of the server blades 903, a fan module is associated with the server blade. In this embodiment, fan modules 931A-931E, collectively referred to as fan modules 931, and are associated with server blades 903A-903D respectively. Each of the fan modules 931 includes one or more cooling fans. Fan modules 931 may be mounted on the backends of server blades 903 to generate airflows flowing from frontend 904, traveling through the air space of the sever blades 903, and existing at backend 905 of electronic rack 900.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein. As an example, cooling device 108 shown in FIG. 7 may connect to 925 to complete a full fluid loop.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling.

It should be understood that the various features shown with respect to one figure can also be present in other embodiments of different feature.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A battery module, comprising:
    an evaporation chamber;
    one or more battery cells immersed in a fluid, the one or more battery cells and the fluid being housed in the evaporation chamber; and a condenser being in fluid connection with the evaporation chamber through one or more vapor channels and one or more liquid channels, wherein, during operation, thermal energy from the one or more battery cells is absorbed by the fluid causing the fluid to change from liquid to vapor and travel through the one or more vapor channels into the condenser, and wherein the vapor changes back to liquid in the condenser and returns to the evaporation chamber through the one or more liquid channels, wherein the one or more liquid channels are located along walls of the evaporation chamber surrounding the one or more battery cells and the one or more vapor channels are located in a remaining area of the evaporation chamber above the one or more battery cells.

2. The battery module of claim 1, wherein the condenser is located apart from the evaporation chamber, connected through one or more vapor lines and one or more liquid lines that form the one or more vapor channels and the one or more liquid channels, respectively.

3. The battery module of claim 2, wherein the condenser is located at a higher position than the evaporation chamber.

4. The battery module of claim 1, wherein the one or more vapor channels has an opening at the evaporator that is larger than an opening of the one or more liquid channels at the evaporator.

5. The battery module of claim 1, wherein the condenser is located above the evaporation chamber.

6. The battery module of claim 1, wherein the one or more vapor channels are located at a first side of the evaporation chamber and the one or more liquid channels are located at a second side of the evaporation chamber being opposite the first side.

7. The battery module of claim 5, wherein the one or more vapor channels has an opening at the evaporator that is larger than an opening of the one or more vapor channels at the condenser to funnel the vapor to the condenser.

8. The battery module of claim 5, wherein a condensing chamber of the condenser is horizontally sloped such that an opening of the one or more vapor channels is higher than an opening of the one or more liquid channels to guide the liquid in the condensing chamber towards the one or more liquid channels.

9. The battery module of claim 1, wherein a cooling member of the condenser has one or more fins or grooves that provide additional surface area to remove and transfer heat away from the battery module through air cooling.

10. The battery module of claim 1, wherein the condenser has a coolant dispersed in one or more cooling channels, the coolant circulating to and from the condenser during operation to remove heat from the battery module, wherein the coolant is circulated to and from the condenser by a manifold of an electronics rack enclosure that the battery module, or a battery pack that includes a plurality of battery modules, is housed in.

11. The battery module of claim 1, wherein the battery module is one of a plurality of battery modules that form a battery pack, and the battery pack is housed in an electronics rack enclosure, the battery pack supplying back-up battery power to other electronics housed in the electronics rack.

12. The battery module of claim 1, wherein each of the one or more vapor channels are larger in cross section or diameter than each of the one or more liquid channels.

13. The battery module of claim 1, wherein an opening of the one or more vapor channels to the evaporation chamber covers a majority of space at a top area of the evaporation chamber.

14. A battery pack, comprising:
a plurality of battery modules, each of the battery modules including:
an evaporation chamber;
one or more battery cells immersed in a fluid, the one or more battery cells and the fluid being housed in the evaporation chamber; and
a condenser located above the evaporation chamber being in fluid connection with the evaporation chamber through one or more vapor channels and one or more liquid channels, wherein, during operation, thermal energy from the one or more battery cells is absorbed by the fluid causing the fluid to change from liquid to vapor and travel through the one or more vapor channels into the condenser, and wherein the vapor changes back to liquid in the condenser and returns to the evaporation chamber through the one or more liquid channels,
wherein a condensing chamber of the condenser is horizontally sloped such that an opening of the one or more vapor channels is higher than an opening of the one or more liquid channels to guide the liquid in the condensing chamber towards the one or more liquid channels.

15. The battery pack of claim 14, wherein the one or more vapor channels are located at a first side of the evaporation chamber and the one or more liquid channels are located at a second side of the evaporation chamber being opposite the first side.

16. The battery pack of claim 15, wherein the one or more vapor channels has an opening at the evaporator that is larger than an opening of the one or more vapor channels at the condenser to funnel the vapor to the condenser.

17. An electronics rack, comprising:
a stack of one or more server blades, wherein each of the server blades includes one or more information technology (IT) components operatively to provide data processing services to one or more clients;
a power supply coupled to provide power to the IT components of the server blades; and
a battery pack coupled to the server blades to provide backup power to the IT components of the server blades in response to determining that the power supply is unavailable, the battery pack having one or more battery modules, wherein each of the battery modules includes:
an evaporation chamber,
one or more battery cells immersed in a fluid, the one or more battery cells and the fluid being housed in the evaporation chamber, and
a condenser located above the evaporation chamber being in fluid connection with the evaporation chamber through one or more vapor channels and one or more liquid channels, wherein, during operation, thermal energy from the one or more battery cells is absorbed by the fluid causing the fluid to change from liquid to vapor and travel through the one or more vapor channels into the condenser, and wherein the vapor changes back to liquid in the condenser and returns to the evaporation chamber through the one or more liquid channels,
wherein a condensing chamber of the condenser is horizontally sloped such that an opening of the one or more vapor channels is higher than an opening of the one or more liquid channels to guide the liquid in the condensing chamber towards the one or more liquid channels.

18. The electronic rack of claim 17, wherein the one or more vapor channels are located at a first side of the evaporation chamber and the one or more liquid channels are located at a second side of the evaporation chamber being opposite the first side.

19. The electronic rack of claim 18, wherein the one or more vapor channels has an opening at the evaporator that is larger than an opening of the one or more vapor channels at the condenser to funnel the vapor to the condenser.

* * * * *